US008785268B2

(12) United States Patent
Zheng et al.

(10) Patent No.: US 8,785,268 B2
(45) Date of Patent: Jul. 22, 2014

(54) MEMORY SYSTEM WITH FIN FET TECHNOLOGY

(75) Inventors: Wei Zheng, Santa Clara, CA (US); Lei Xue, Sunnyvale, CA (US); Kuo-Tung Chang, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 243 days.

(21) Appl. No.: 11/614,815

(22) Filed: Dec. 21, 2006

(65) Prior Publication Data

US 2008/0150029 A1 Jun. 26, 2008

(51) Int. Cl.
*H01L 21/8238* (2006.01)

(52) U.S. Cl.
USPC ............ 438/211; 257/E21.409; 257/E21.422; 257/E21.662; 257/E29.129

(58) Field of Classification Search
USPC ......... 438/197–199, 211–212, 216, 255–266, 438/279–284
See application file for complete search history.

(56) References Cited

U.S. PATENT DOCUMENTS

| 6,768,158 | B2 | 7/2004 | Lee et al. |
| 6,933,558 | B2 | 8/2005 | Hill et al. |
| 6,967,143 | B2 | 11/2005 | Mathew et al. |
| 7,098,502 | B2 | 8/2006 | Mathew et al. |
| 7,170,132 | B2 * | 1/2007 | Ogura et al. .................. 257/324 |
| 2005/0199944 | A1 * | 9/2005 | Chen et al. .................... 257/324 |
| 2005/0242391 | A1 | 11/2005 | She et al. |
| 2006/0234456 | A1 * | 10/2006 | Anderson et al. ............. 438/284 |
| 2008/0087946 | A1 * | 4/2008 | Hsu et al. ...................... 257/328 |
| 2008/0142875 | A1 * | 6/2008 | Lee et al. ...................... 257/324 |

* cited by examiner

*Primary Examiner* — Daniel Whalen
(74) *Attorney, Agent, or Firm* — Sterne, Kessler, Goldstein & Fox P.L.L.C.

(57) ABSTRACT

A method for manufacturing a memory system is provided including forming a charge-storage layer on a first insulator layer including insulating the charge-storage layer from a vertical fin, forming a second insulator layer from the charge-storage layer, and forming a gate over the second insulator includes forming a fin field effect transistor.

21 Claims, 5 Drawing Sheets

US 8,785,268 B2

MEMORY SYSTEM WITH FIN FET TECHNOLOGY

TECHNICAL FIELD

The present invention relates generally to memory system and more particularly to non-volatile memory system.

BACKGROUND ART

Modern electronics, such as smart phones, personal digital assistants, location based services devices, digital cameras, music players, servers, and storage arrays, are packing more integrated circuits into an ever shrinking physical space with expectations for decreasing cost. One cornerstone for electronics to continue proliferation into everyday life is the non-volatile storage of information such as cellular phone numbers, digital pictures, or music files. Numerous technologies have been developed to meet these requirements.

As semiconductor technologies shrink the feature size of active components, more function is packed into each integrated device. In order to keep up with the trend of shrinking component size, there is a need for further memory cell size reduction. As the cell size shrinks, there are several issues that need to be addressed. One of them is the short channel effect that degrades the cell performance as the channel length shrinks. Another issue is the reduction in drive current as the channel width shrinks, which also degrades the cell performance.

"Flash" EEPROM, or Flash memory, combines the advantages of the high density and low cost of EPROM with the electrical eraseability of EEPROM. Flash memory can be rewritten electrically and can hold its contents without power. Contemporary Flash memories are designed in a floating gate or a charge trapping architecture. Each architecture has advantages and disadvantages.

The floating gate architecture offers implementation simplicity. This architecture embeds a gate structure, called a floating gate, inside a conventional metal oxide semiconductor (MOS) transistor gate stack. Electrons can be injected and stored in the floating gate as well as erased using an electrical field or ultraviolet light. The stored information may be interpreted as a value "0" or "1" from the threshold voltage value depending upon charge stored in the floating gate. As the demand for Flash memories increases, the Flash memories must scale with new semiconductor processes. However, new semiconductor process causes a reduction of key feature sizes in Flash memories of the floating gate architecture which results in undesired increase in programming time and decrease in data retention.

The charge trapping architecture offers improved scalability to new semiconductor processes compared to the floating gate architecture. One implementation of the charge trapping architecture is a silicon-oxide-nitride-oxide semiconductor (SONOS) where the charge is trapped in the nitride layer. Leakage and charge-trapping efficiency are two major parameters considered in device performance evaluation. Charge-trapping efficiency determines if the memory devices can keep enough charges in the storage nodes after program/erase operation and is reflected in retention characteristics. It is especially critical when the leakage behavior of storage devices is inevitable. SONOS Flash memories suffer from poor programming performance. Silicon content in the nitride layer improves the programming and erasing performances but offers poor data retention. Although silicon content plays an important role in charge-trapping efficiency, it does not have the same constructive effect on leakage characteristics.

A significant amount of research has been undertaken to produce Fin FET technology. The design utilizes a silicon fin protruding from the substrate to form a source/drain structure and a gate structure patterned perpendicular to the source/drain structure. The gate wraps around the fin. This geometry creates a double gate on the Fin FET reducing leakage current when in the off state.

An aspect of the Fin FET is that the gate wraps around the fin like channel, thus it has increased gate control to reduce the short channel effect. The channel length scaling becomes easier. At the same time, the gate wrap-around also increases the actual channel width from the side wall of the fin, without increasing the physical channel width. The Fin FET concept can be applied to both floating gate and nitride based technology. However, due to the ONO interpoly layer and physical size of the floating gate, the cell size scalability advantage of Fin FET for floating gate technology is not as great as it is for nitride based FLASH technology.

Thus, a need still remains for a memory system providing low cost manufacturing, improved yields, improved programming performance, and improved data retention of memory in a memory sub-system. In view of the ever-increasing need to save costs and improve efficiencies, it is more and more critical that answers be found to these problems.

Solutions to these problems have long been sought but prior developments have not taught or suggested any solutions and, thus, solutions to these problems have long eluded those skilled in the art.

DISCLOSURE OF THE INVENTION

The present invention provides a method for manufacturing a memory system including forming a charge-storage layer on a first insulator layer including insulating the charge-storage layer from a vertical fin, forming a second insulator layer from the charge-storage layer, and forming a gate over the second insulator includes forming a fin field effect transistor.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
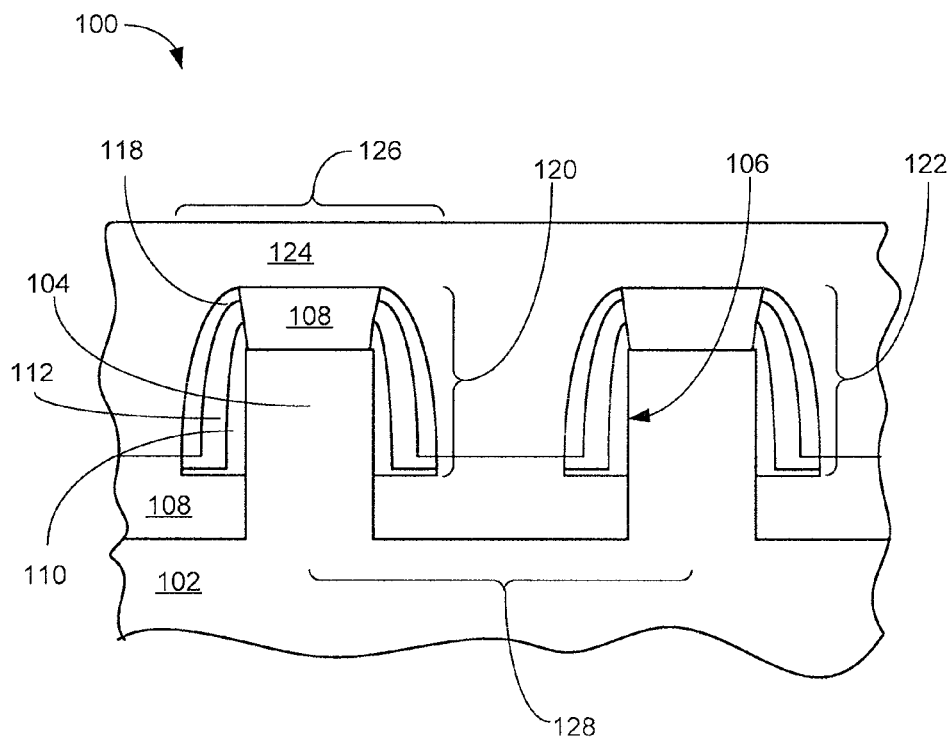
FIG. 1 is a cross-sectional view of a memory system with Fin FET technology, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the semiconductor substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes stamping, forging, patterning, exposure, development, etching, cleaning, and/or removal of the material or laser trimming as required in forming a described structure.

Referring now to FIG. 1, therein is shown a cross-sectional view of a memory system 100 with Fin FET technology, in an embodiment of the present invention. The cross-sectional view of the memory system 100 depicts a semiconductor substrate 102 being a continuous layer having a vertical fin 104 that protrudes vertically from and of the semiconductor substrate 102 and has a sloped sidewall 106 that may be substantially vertical. An oxide layer 108, such as a silicon dioxide ($SiO_2$), is over the semiconductor substrate 102 and the vertical fin 104. The oxide layer 108 has a minimum thickness of 40 Å in order to provide reliable data retention and prevent inadvertent tunnel erasure.

A first insulator layer 110, such as a dielectric layer of silicon dioxide ($SiO_2$), is deposited on the sloped sidewall 106 of the vertical fin 104. A charge-storage layer 112 is on the first insulator layer 110. The charge-storage layer 112 provides regions for storage of the electrical charge. The charge-storage layer 112 may include a silicon rich nitride (SiRN) layer or a silicon nitride layer or any other appropriate layer for storing electrons. It may also consist of a bi-layer with a less silicon rich nitride covering a more silicon rich nitride layer. The silicon-rich nitride may be formed by a chemical vapor deposition process (CVD) using $NH_3$ and $SiCl_2H_2$ but not limited to the two chemicals. A ratio of the gases, such as $NH_3:SiCl_2H_2$, range from 1:40 to 1:1 can produce silicon-rich nitride with a ratio of Si to N higher than 0.75.

A second insulator layer 118, such as a dielectric layer of silicon dioxide ($SiO_2$), is on the charge-storage layer 112. The charge-storage layer 112 is completely isolated on either side of the vertical fin 104. A self aligned etch process is used to achieve the isolation of the charge-storage layer 112 without sacrificing the cell size. The complete isolation of the charge-storage layer 112 allows for a more reliable data retention mechanism. A first bit line 120, such as a fin FET, and a second bit line 122 are formed of the vertical fin 104 enclosed within the first insulator layer 110, the charge-storage layer 112, and the second insulator layer 118. A word line 124, such as a gate or a poly-silicon gate is patterned on the first bit line 120 and the second bit line 122.

The resulting structure is the memory system 100 having a self aligned SONOS Fin FET 126, such as a FLASH memory cell. The self aligned SONOS Fin FET 126 may minimize a pitch 128 between the FLASH memory cells.

Figure 2:
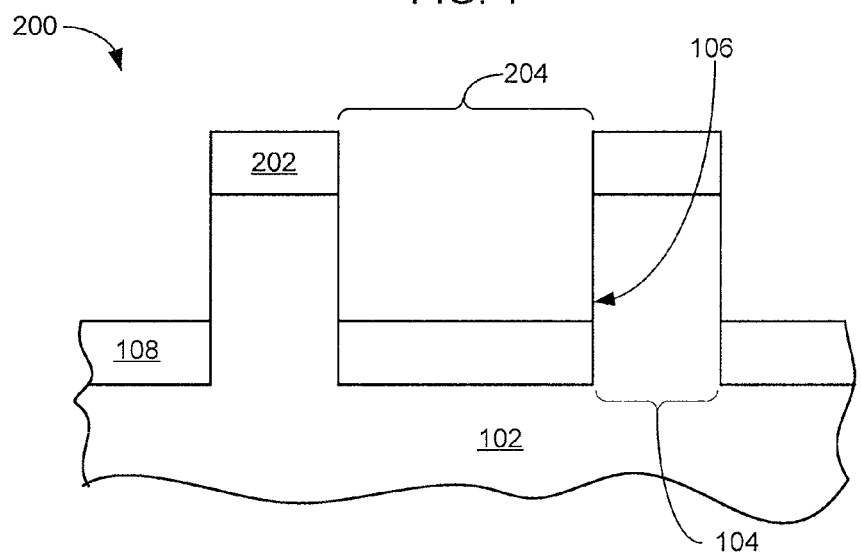
FIG. 2 is a cross-sectional view of a semiconductor substrate, with the vertical fin, in an oxide deposition phase of manufacturing.

Referring now to FIG. 2, therein is shown a cross-sectional view of a semiconductor substrate 200, with the vertical fin 104, in an oxide deposition phase of manufacturing. The cross-sectional view of the semiconductor substrate 200 depicts a hard mask 202 over the vertical fin 104 of FIG. 1. A trench 204 is formed by an etch process between the patterned areas of the hard mask 202 in order to remove portions of the semiconductor substrate 102 and expose the vertical fin 104. The sloped sidewall 106 of the vertical fin 104 is shown in a vertical position for example only and the actual slope of the sloped sidewall 106 may differ. The oxide layer 108 is formed on the surface of the semiconductor substrate 102 that is not covered by the hard mask 202. The oxide layer 108 extends up the sloped sidewall 106 of the vertical fin 104, but leaves a portion of the sloped sidewall 106 exposed for further processing.

Figure 3:
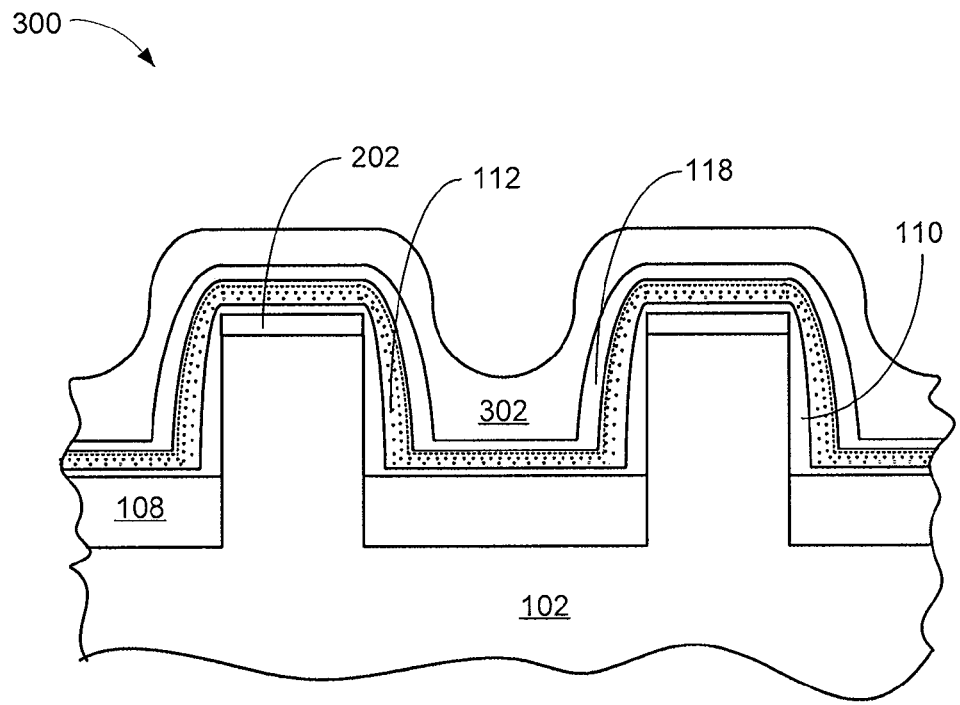
FIG. 3 is a cross-sectional view of the semiconductor substrate of FIG. 2 in a poly-silicon deposition phase of manufacturing.

Referring now to FIG. 3, therein is shown a cross-sectional view of a semiconductor substrate 300 in a poly-silicon deposition phase of manufacturing. The cross-sectional view of the semiconductor substrate 300 depicts the first insulator layer 110 over the oxide layer 108 and the hard mask 202. In successive operations the charge-storage layer 112, and the second insulator layer 118 are deposited over the first insulator layer 110. A poly-silicon layer 302 is deposited on the surface of the second insulator layer 118. In the fabrication of the charge-storage layer 112, the relative concentration of silicon and nitrogen may differ. The result may cause the charge-storage layer 112 to appear as two distinct layers, though the intent is to have a single layer that may have a gradient concentration of silicon and nitrogen across its thickness.

Figure 4:
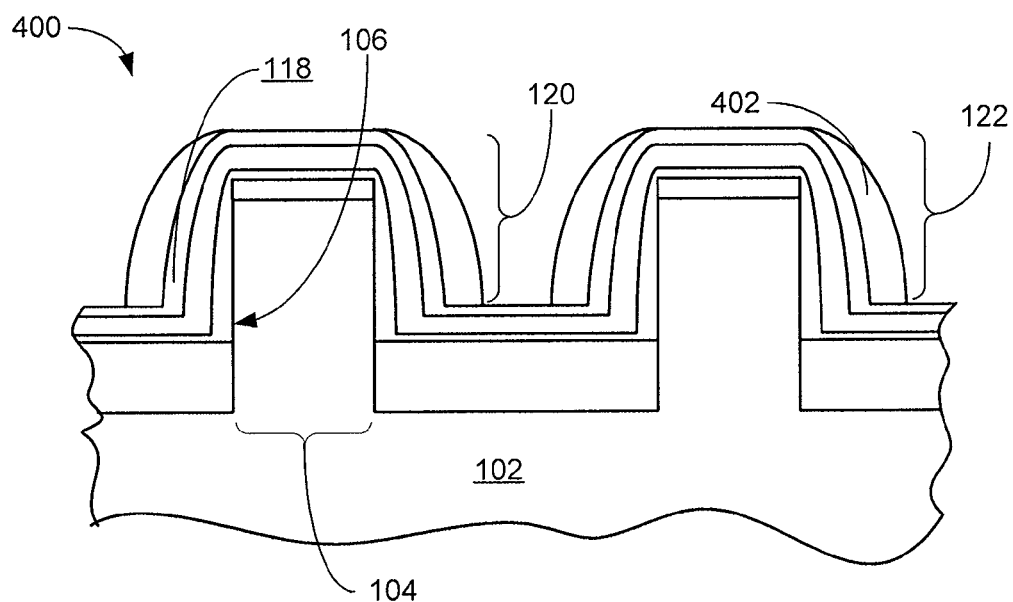
FIG. 4 is a cross-sectional view of the semiconductor substrate of FIG. 3 in a poly spacer forming phase of manufacture.

Referring now to FIG. 4, therein is shown a cross-sectional view of a semiconductor substrate 400 in a poly spacer forming phase of manufacture. The cross-sectional view of the semiconductor substrate 400 depicts the poly-silicon layer 302 of FIG. 3, having gone through an etching and chemical mechanical polishing (CMP) in order to form a poly spacer 402.

The etch and CMP processes expose the second insulator layer 118 above the vertical fin 104 and between the first bit line 120 and the second bit line 122. The poly spacer 402 protects the layers deposited on the sloped sidewall 106 of the vertical fin 104.

Figure 5:
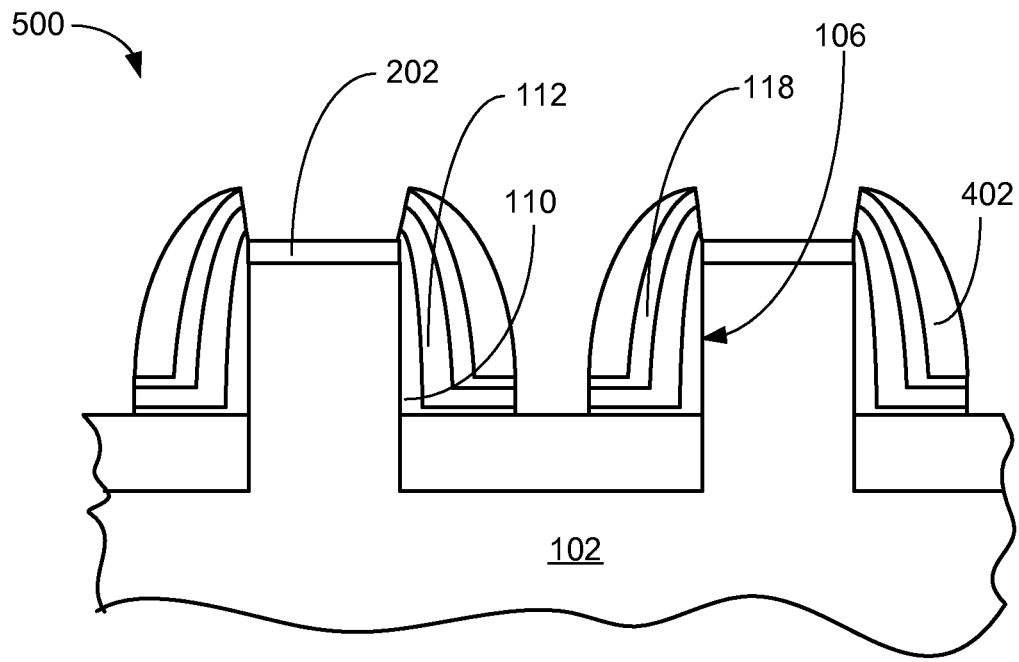
FIG. 5 is a cross-sectional view of the semiconductor substrate of FIG. 4 in a nitride over-etch phase of manufacturing.

Referring now to FIG. 5, therein is shown a cross-sectional view of a semiconductor substrate 500 in a nitride over-etch phase of manufacturing. The cross-sectional view of the semiconductor substrate 500 depicts the hard mask 202 exposed after an etch process that removed the second insulator layer 118, the charge-storage layer 112, and the first insulator layer 110 in all of the areas not protected by the poly spacer 402.

This process is in preparation for removing the hard mask 202 and the poly spacer 402. The layers deposited on the sloped sidewall 106 are isolated from each other. The reactive nature of the etch may cause the charge-storage layer 112 to be over etched. This over etch process may cause the layer to recede beneath the second insulator layer 118.

Figure 6:
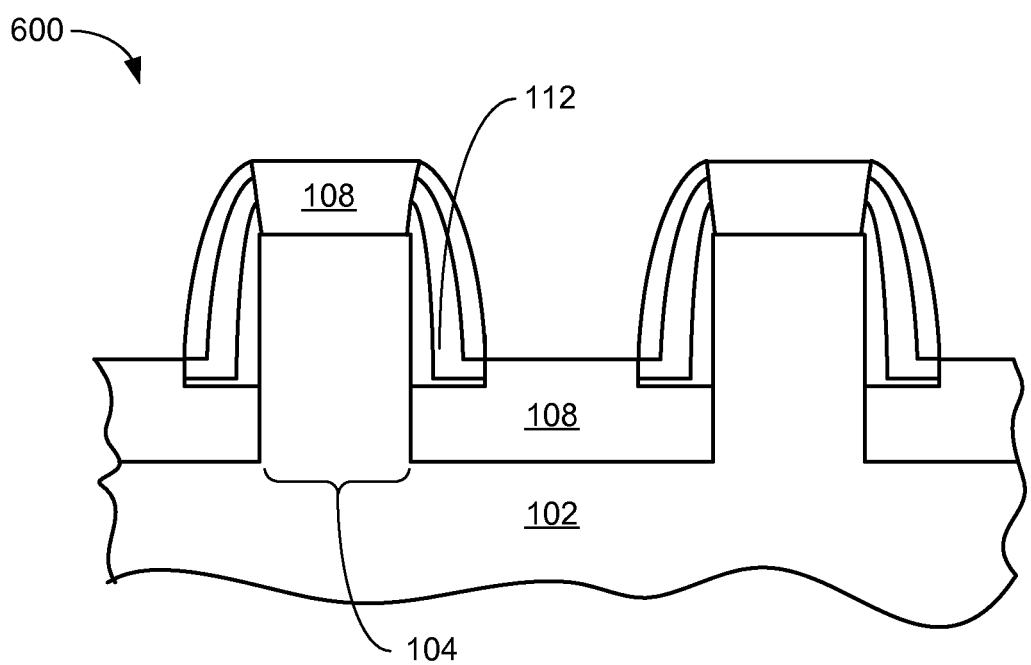
FIG. 6 is a cross-sectional view of the semiconductor substrate of FIG. 5 in an oxide deposition phase of manufacturing.

Referring now to FIG. 6, therein is shown a cross-sectional view of a semiconductor substrate 600 in an oxide deposition phase of manufacturing. The cross-sectional view of the semiconductor substrate 600 depicts the oxide layer 108 filling the area over the vertical fin 104 and filling the areas of the over etch of the charge-storage layer 112.

Figure 7:
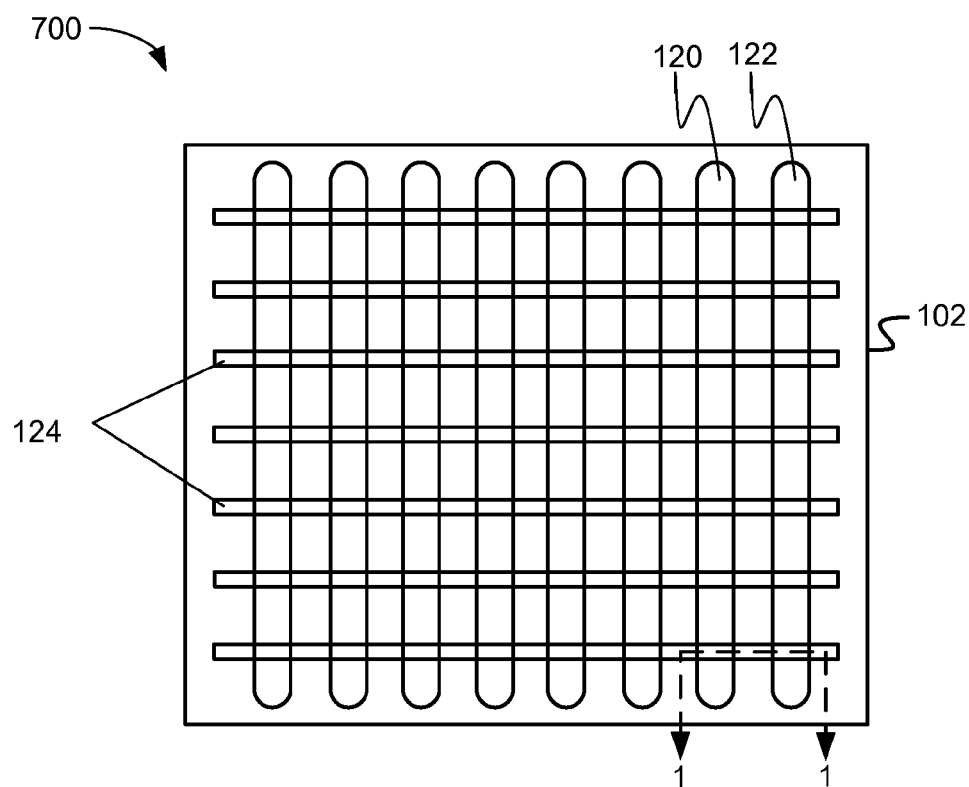
FIG. 7 is a plan view of a portion of a memory array system in an embodiment of the present invention.

Referring now to FIG. 7, therein is shown a plan view of a portion of a memory sub-system 700 in an embodiment of the present invention. The memory sub-system 700 is an M×N array of the memory system 100. The semiconductor substrate 102 has a plurality of the first bit line 120 and the second bit line 122 as implanted bit lines extending in parallel with a plurality of the word line 124 extending in parallel and at right angles to the plurality of implanted bit lines. The word line 124 and bit lines have contacts and interconnections (not shown) to the programming circuitry to be discussed further in FIG. 8.

Figure 8:
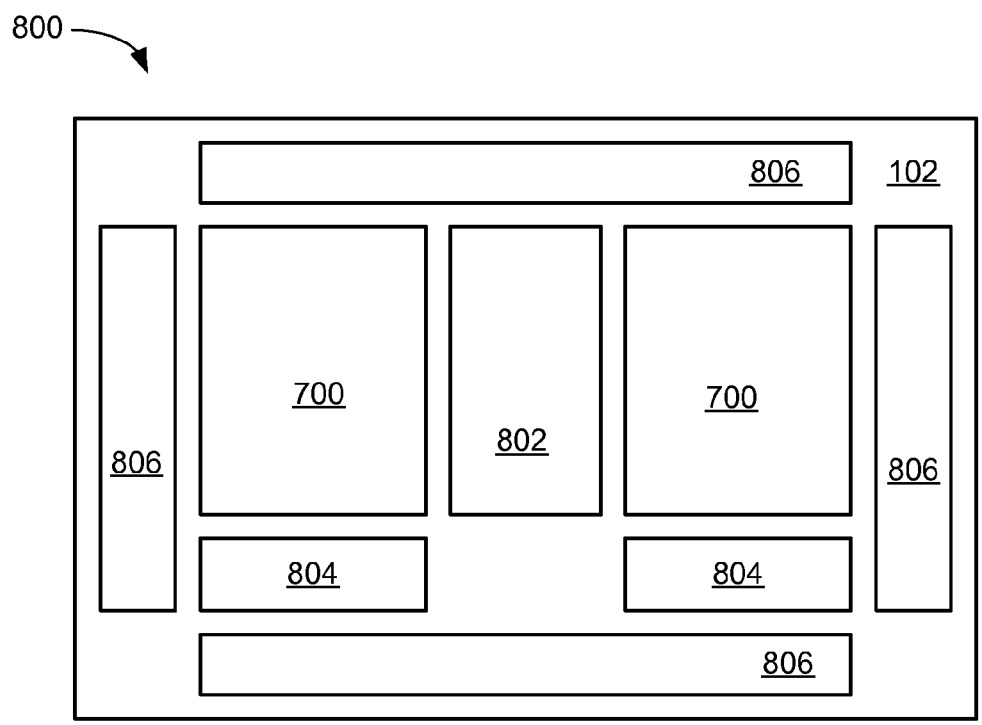
FIG. 8 is a plan view of a device in an embodiment of the present invention.

Referring now to FIG. 8, therein is shown a plan view of a device 800 in an embodiment of the present invention. The device 800 is a semiconductor device including the memory sub-system 700 as well as the memory system 100. The device 800 commonly includes the semiconductor substrate 102 in which one or more high-density core regions and one or more low-density peripheral portions are formed.

High-density core regions typically include one or more of the memory sub-system 700 of individually addressable, substantially identical to the memory system 100 of FIG. 1. Low-density peripheral portions typically include input/output (I/O) circuitry and programming circuitry for individually and selectively addressing the memory system 100. The programming circuitry is represented in part by and includes one or more of an x-decoder 802 and a y-decoder 804, cooperating with an I/O circuitry 806 for connecting the source, gate, and drain of selected addressed memory cells to predetermined voltages or impedances to effect designated operations on the memory cell, e.g., programming, reading, and erasing, and deriving necessary voltages to effect such operations.

For illustrative purposes, the device 800 is shown as a memory device, although it is understood that the device 800 may other semiconductor devices having other functional blocks, such as a digital logic block, a processor, or other types of memories. Also for illustrative purposes, the device 800 is described as a single type of semiconductor device, although it is understood that the device 800 may be a multi-chip module utilizing the present invention with other types of devices of similar or different semiconductor technologies, such as power devices or micro-electro-mechanical systems (MEMS). Further for illustrative purposes, the device 800 is described as a semiconductor device, although it is understood that the device 800 may be a board level product including the present invention.

Figure 9:
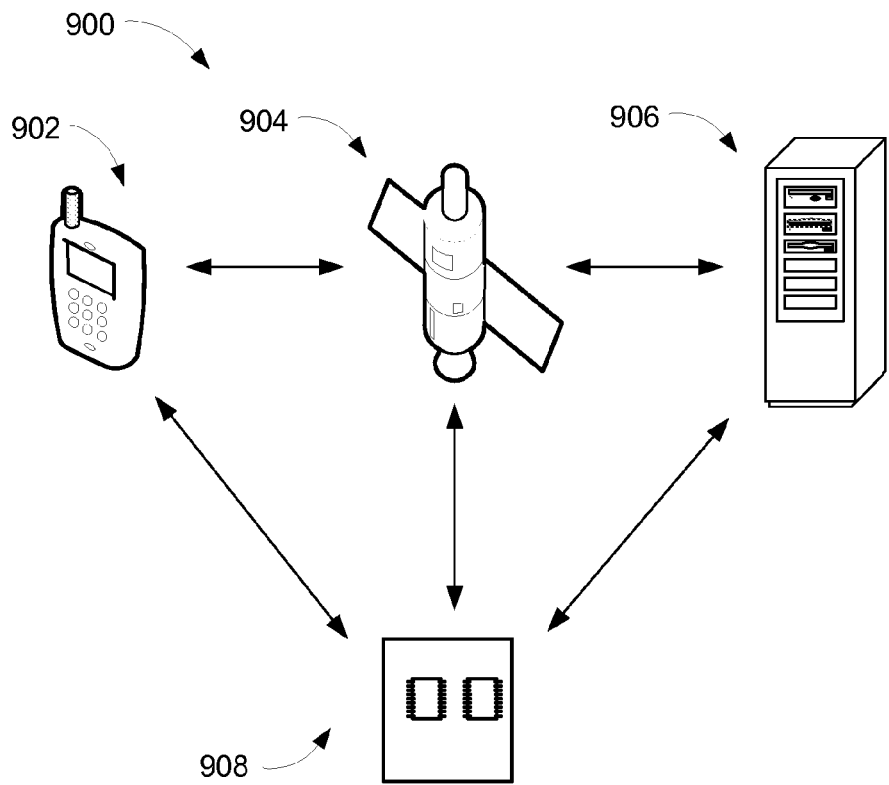
FIG. 9 are electronics systems in an embodiment of the present invention.

Referring now to FIG. 9, therein is shown an electronic system 900 in an embodiment of the present invention. A smart phone 902, a satellite 904, and a compute system 906 are examples of the electronic system 900 using the present invention. The electronic system 900 may be any system that performs any function for the creation, transportation, storage, and consumption of information. For example, the smart phone 902 may create information by transmitting voice to the satellite 904. The satellite 904 is used to transport the information to the compute system 906. The compute system 906 may be used to store the information. The smart phone 902 may also consume information sent from the satellite 904. A printed circuit board 908 containing the memory system 100 of the present invention may be present in any of the electronic systems 900 indicated above. It may be used for storing the information that is received, transmitted or programmed into the devices.

Figure 10:
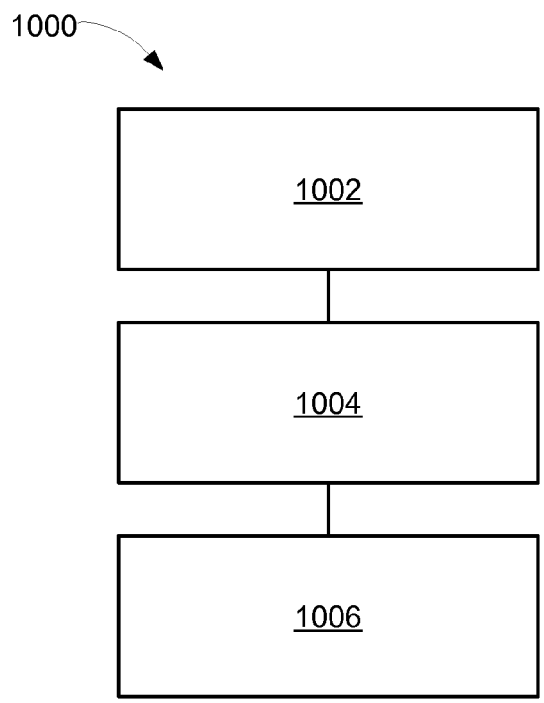
FIG. 10 is a flow chart of a system for a memory cell in an embodiment of the present invention.

Referring now to FIG. 10, therein is shown a flow chart of a method 1000 for manufacturing the memory system 100 in an embodiment of the present invention. The method 1000 includes forming a charge-storage layer on a first insulator layer including insulating the charge-storage layer from a vertical fin in a block 1002; forming a second insulator layer from the charge-storage layer in a block 1004; and forming a gate over the second insulator includes forming a fin field effect transistor in a block 1006.

It has been discovered that the present invention thus has numerous aspects.

A principle an aspect of different embodiments of the present invention is that the use of silicon rich nitride in the charge-storage layer provides orders of magnitude better charge trapping capabilities.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the memory system with Fin FET technology of the present invention furnishes important and heretofore unknown and unavailable solutions, capabilities, and functional aspects for manufacturing highly reliable flash memory. The resulting processes and configurations are straightforward, cost-effective, uncomplicated, highly versatile and effective, can be surprisingly and unobviously implemented by adapting known technologies, and are thus readily suited for efficiently and economically manufacturing memory devices or digital functions that contain flash memory, fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method for manufacturing a memory system comprising:

forming a vertical fin of a semiconductor substrate being a continuous layer, the vertical fin protruding vertically, and being part of the semiconductor substrate;

forming a charge-storage layer on a first insulator layer including insulating the charge-storage layer from the vertical fin;

forming a second insulator layer from the charge-storage layer;

removing at least portions of the first insulator layer, the charge storage layer and the second insulator layer from above the vertical fin such that the charge storage layer is isolated on both sides of the vertical fin; and forming a gate over the vertical fin to thereby form a fin field effect transistor.

2. The method as claimed in claim 1 wherein forming the charge-storage layer includes forming a silicon rich nitride layer.

3. The method as claimed in claim 1 wherein the fin field effect transistor is a self aligned SONOS fin field effect transistor.

4. The method as claimed in claim 1 wherein forming the second insulator layer includes steam oxidizing an outer portion of the charge-storage layer.

5. The method as claimed in claim 1 further comprising:
forming a memory sub-system with the memory system; and
forming a device, a printed circuit board, or an electronic system with the memory sub-system.

6. A method for manufacturing a memory system comprising:
forming a vertical fin of a semiconductor substrate being a continuous layer, the vertical fin protruding vertically, and being part of the semiconductor substrate and having a sloped sidewall substantially vertical, wherein the vertical fin is capped by an oxide layer, and the oxide layer is in direct contact with a word line;
forming a silicon rich nitride layer on a first dielectric layer including insulating the silicon rich nitride layer from the vertical fin, wherein the silicon rich nitride layer is a charge-storage layer;
steam oxidizing a second dielectric layer from the charge-storage layer; and
forming the word line over the vertical fin to thereby form a fin field effect transistor.

7. The method as claimed in claim 6 wherein steam oxidizing the second dielectric layer on the charge-storage layer includes isolating the silicon rich layer from the word line.

8. The method as claimed in claim 6 wherein the fin field effect transistor is a self aligned SONOS fin field effect transistor.

9. The method as claimed in claim 6 wherein forming the silicon rich nitride layer includes forming a gradient concentration of silicon in the silicon rich nitride layer.

10. The method as claimed in claim 6 further comprising patterning the word line on the second dielectric layer.

11. A memory system comprising:
a semiconductor substrate being a continuous layer;
a vertical fin formed of the semiconductor substrate, the vertical fin protruding vertically, and being part of the semiconductor substrate;
a plurality of first insulator layers on both sides of the vertical fin;
a plurality of charge-storage layers on each of the first insulator layers, wherein the charge-storage layers are isolated on both sides of the vertical fin;
a plurality of second insulator layers on the charge-storage layers; and
a gate on the vertical fin.

12. The system as claimed in claim 11 wherein the charge-storage layer includes a silicon rich nitride layer.

13. The system as claimed in claim 11 further comprising a self aligned SONOS fin field effect transistor formed on the vertical fin.

14. The system as claimed in claim 11 wherein the second insulator layer includes the charge-storage layer having an outer portion oxidized.

15. The system as claimed in claim 11 further comprising:
a memory sub-system with the memory system; and
a device, a printed circuit board, or an electronic system with the memory sub-system.

16. The system as claimed in claim 11 wherein:
the first insulator layers are first dielectric layers on the vertical fin;
the charge-storage layers are silicon rich nitride layers on the first insulator layers;
the second insulator layers are second dielectric layers from the charge-storage layers; and
the gate is a poly-silicon gate on the second dielectric layers.

17. The system as claimed in claim 16 wherein the second dielectric layer on the charge-storage layer isolates the charge-storage layer from a word line.

18. The system as claimed in claim 16 further comprising a self aligned SONOS fin field effect transistor.

19. The system as claimed in claim 16 wherein the charge-storage layer includes the silicon rich nitride layer having a gradient concentration.

20. The system as claimed in claim 16 further comprising a word line patterned on the second dielectric layer.

21. The method of claim 1, further comprising:
forming the first insulator layer continuously on sidewalls and over the vertical fin.

* * * * *